United States Patent [19]

Schaefer et al.

[11] Patent Number: 4,719,406

[45] Date of Patent: Jan. 12, 1988

[54] PHANTOM FOR PERFORMANCE EVALUATION OF A NUCLEAR MAGNETIC RESONANCE SCANNER

[75] Inventors: Daniel J. Schaefer, Waukesha; Robert W. Newman, Milwaukee, both of Wis.

[73] Assignee: General Electric Company, Milwaukee, Wis.

[21] Appl. No.: 827,846

[22] Filed: Feb. 7, 1986

[51] Int. Cl.⁴ ............................................. G01R 33/24
[52] U.S. Cl. ...................................... 324/318; 324/300
[58] Field of Search ............... 324/300, 307, 309, 311, 324/318, 308

[56] References Cited

U.S. PATENT DOCUMENTS

| | | | |
|---|---|---|---|
| 4,385,277 | 5/1983 | Hanley | 324/309 |
| 4,551,678 | 11/1985 | Morgan | 324/300 |
| 4,613,819 | 9/1986 | Chui | 324/318 |

FOREIGN PATENT DOCUMENTS 58-150846  9/1983  Japan .
59-15844  1/1984  Japan .

OTHER PUBLICATIONS

W. A. Edelstein, P. A. Bottomley and L. M. Pfeifer, "A Signal-to-Noise Calibration Procedure for NMR imaging Systems", Med. Phys. 11(2), Mar./Apr. 1984, pp. 180-185.

Primary Examiner—Michael J. Tokar
Assistant Examiner—Kevin D. O'Shea
Attorney, Agent, or Firm—Douglas E. Stoner

[57] ABSTRACT

There is provided a phantom for measuring a performance parameter of a nuclear magnetic resonance scanner capable of acquiring NMR data from a study object. The phantom is made up of a housing composed of a substantially non-NMR-active material, and positionable in use within a radio-frequency coil forming part of an NMR scanner. The phantom further includes a first medium disposed within the housing to load the radio frequency coil in a manner similar to that of a patient. The NMR properties of the medium are further selected such that an NMR signal, if any, produced by the medium occurs at a time other than when a performance parameter of said NMR scanner is measured. In the preferred embodiment, the phantom comprises two concentrically disposed cylinders of different diameters and a pair of end plates fastened to opposite ends of the cylinders. The first medium is disposed within the volume defined between the side walls of the cylinders and the end plates. A second medium is disposed within the volume defined within the innermost cylinder and generates the NMR test signals.

27 Claims, 2 Drawing Figures

PHANTOM FOR PERFORMANCE EVALUATION OF A NUCLEAR MAGNETIC RESONANCE SCANNER

BACKGROUND OF THE INVENTION

This invention relates to test devices, generally referred to as phantoms. More specifically, this invention relates to a phantom useful with nuclear magnetic resonance (NMR) scanner apparatus to carry out performance and calibration measurements.

A phantom generally comprises a test object constructed to simulate structures and conditions encountered in actual clinical use of the NMR scanner. In the case of medical diagnostic applications, the phantom can be made to simulate various types of tissue and can be used as a substitute test object in operator training, as well as a calibration device to ascertain the level of scanner performance. In some cases, it is desirable to ascertain the degree of scanner operability by frequent calibration procedures. The phantom therefore must be constructed to allow evaluation of multiple system quality parameters with relative ease and a minimum expenditure of operator time and effort.

As is now well known, NMR techniques have been developed capable of acquiring spectroscopic and imaging information about the internal anatomical features of humans, for example. This information can be analyzed to determine such tissue-related parameters as nuclear spin distribution, spin lattice ($T_1$), and/or spin spin ($T_2$) relaxation constants believed to be of medical diagnostic value in determining the state of health of tissue in the region examined. In the course of an examination, the patient region of interest is positioned in a substantialy uniform polarizing magnetic field produced by one of several known means, such as resistive, superconductive, or permanent magnets. Spectroscopic and imaging data are collected by subjecting the region of interest to pulse sequences comprised of magnetic field gradients and radio-frequency (RF) pulses. The magnetic gradient and RF fields are generated by separate coil assemblies positioned in the polarizing magnetic field and have generally cylindrical configurations to accommodate the patient region to be studied. The resonant frequency of the RF coil is selected based on the strength of the polarizing magnetic field and the type of nucleus (e.g., hydrogen, phosphorus, etc.) to be examined.

One of the effects of positioning a patient or another electrically conductive study object within the RF coil is that the coil is "loaded." The RF load is related to the quality factor Q, the coil resonant frequency, and impedance of the coil when the object is placed inside. Thus, for example, an "unloaded" RF coil may have a Q of approximately 350, while a coil with a 75 kg person positiond therein may have its Q lowered to 65. The load to the coil determines the amount of power required from the RF power amplifier necessary to perform the NMR experiment, and determines the level of noise which is included in the received NMR signal used to construct an image, for example. If the load on the RF coil is too low, the RF system will not be stressed adequately, and the noise in the image will not be representative of that found in an anatomical image.

Therefore, a phantom designed to simulate a patient must load the RF coil in a manner similar to an average person in order to provide valid test measurements. Additionally, the phantom must have several other important properties: The phantom or parts thereof must be sufficiently light to be easily carried from place to place; the phantom should allow the evaluation of the inherent polarizing magnetic field and radio-frequency magnetic field uniformity of the scanner apparatus and not itself be a source of this type of distortion in the imaging volume; the image produced by the phantom must include "noise" from all sources of incoherent noise common to clinical imaging (that is, RF coil load, NMR experiment parameters, polarizing and radio-frequency field non-uniformities), while not introducing any image artifacts, itself; the signal-to-noise ratio measurement must be derivable from an image of an object generating the NMR signal; the spin lattice and spin spin relaxation times, and spin density of the phantom material that generates the NMR signal used to produce an image must be representative of the NMR properties of human tissues commonly scanned; the design of the phantom must be such that voxel volume is determined by slice selection (slice profile) and field-of-view performance of the scanner system; and the phantom construction and geometry must be such that it can be scanned in any of the three orthogonal planes (transverse, sagittal and coronal) and present identical images for signal-to-noise evaluation in each of the planes.

Earlier phantom designs have attempted to make a single component phantom that provided both proper loading to the RF coil and generated an NMR signal for the evaluation of signal-to-noise and other performance parameters. The resulting device represented a substantial compromise in several of the requirements stated above.

Accordingly, it is a principal object of the present invention to provide an NMR phantom which satisfies, without significant compromise, the aforementioned phantom properties.

SUMMARY OF THE INVENTION

In accordance with the invention, there is provided a phantom for measuring a performance parameter of a nuclear magnetic resonance scanner capable of acquiring NMR data from a study object. The phantom is made up of a housing, composed of a substantially non-NMR-active material and positionable in use within a radio-frequency coil forming part of the NMR scanner. The phantom further includes a first medium disposed within the housing. The first medium and housing have individual predetermined NMR properties and are capable in use of jointly loading the RF coil in a manner similar to the loading provided by a predetermined study object. The NMR properties of the first medium are further selected such that an NMR signal, if any, produced by the medium occurs at a time other than when a performance parameter of said NMR scanner is measured. A second medium capable of producing an NMR signal useful in measuring a performance parameter of the NMR scanner is further disposed within the housing.

In the preferred embodiment, the phantom comprises two concentrically disposed cylinders of different diameters and a pair of end plates fastened to opposite ends of the cylinders. The first medium is disposed within the volume defined between the side walls of the cylinders and the end plates. The second medium is disposed within the volume defined by the innermost cylinder and generates the NMR test signals.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
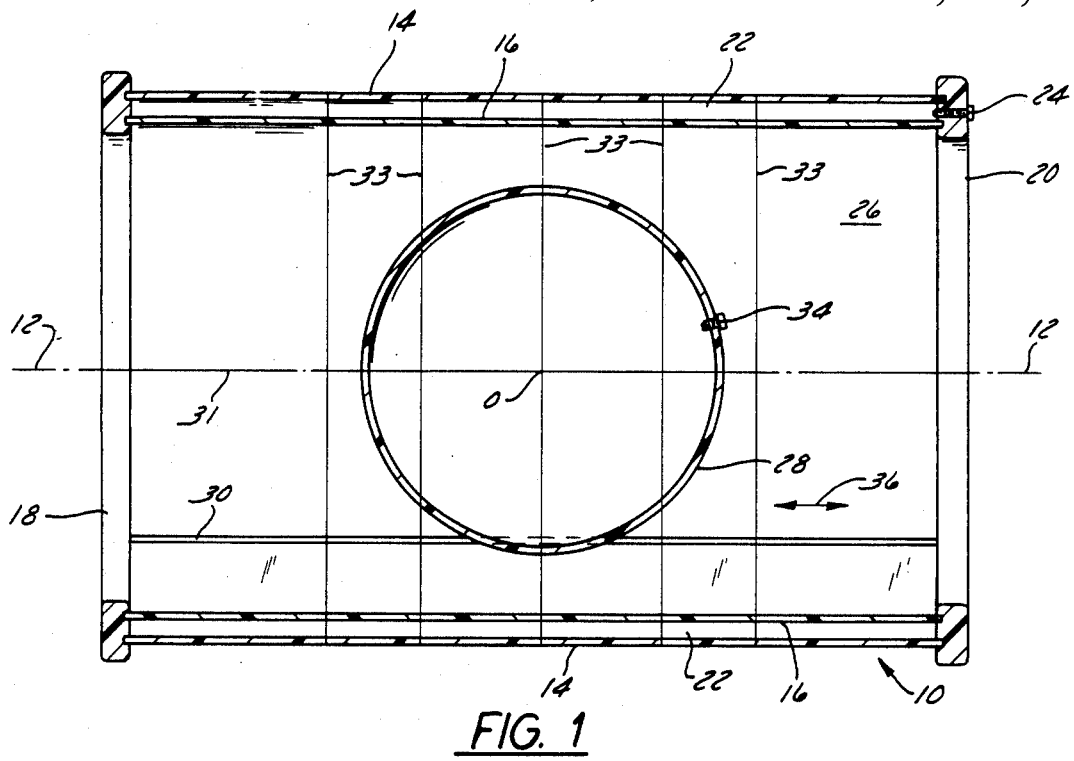
FIG. 1 depicts a side sectional view of one embodiment of the inventive NMR phantom taken along the longitudinal axis.
Figure 2:
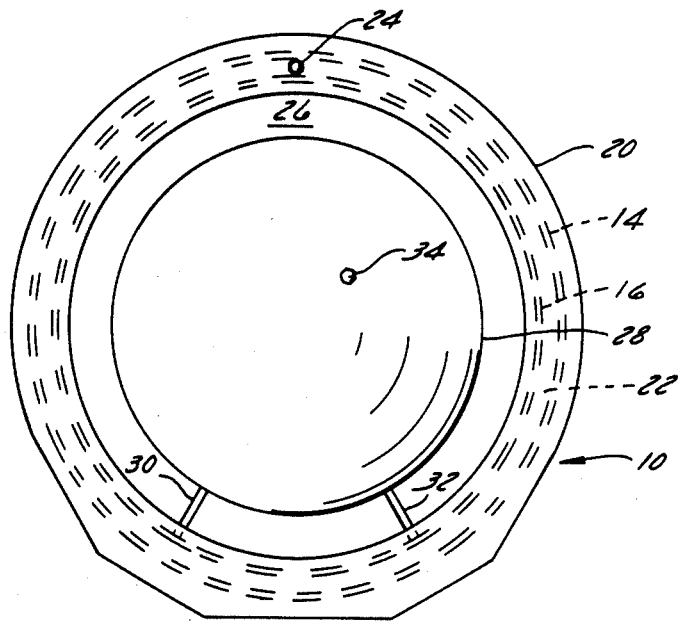
FIG. 2 illustrates an end view of the inventive phantom.

FIGS. 1 and 2 depict, respectively, a side sectional view of the inventive phantom 10 taken along a longitudinal center line 12 and an end view. The phantom is made up, in the preferred embodiment, of two concentric cylinders 14 and 16 secured at the ends to annular end rings 18 and 20. The diameter of outer cylinder 14 is larger than that of inner cylinder 16 thereby defining therebetween a cylindrical space 22 which is adapted to hold a first medium which can be introduced through a fill opening normally closed by a cap 24. A volume 26 defined by cylinder 16 permits placement therein of other test objects, such as sphere 28, supported on rails 30 and 32, having a cap 34 for receiving a second medium. The position of sphere 28 within volume 26 can be adjusted relative to the center of the phantom 0 by movement on rails 30 and 32 as suggested by bidirectional arrow 36. The external surface of outer cylinder 14 may be provided with lines to facilitate alignment of the phantom with the laser patient-positioning lights (not shown) which form part of the NMR scanner. Such lines are suggested in FIG. 1 by a horizontal line designated 31 coincident with line 12 passing through the longitudinal center of the phantom and a plurality of vertical lines located circumferentially on the outer surface of cylinder 14, collectively designated by reference numeral 33.

The phantom is fabricated from materials compatible with NMR applications. Such materials are, for example, non-metallic, non-NMR active and non-hydroscopic. Suitable materials include various types of polycarbonate, acrylic and polystryrene plastics. Acrylic materials are preferred due to their desirable bonding and machining properties. The size of the phantom is selected such that it fits within the RF coil (that is, the head or body coil) and is approximately equal to the length of the coil. In general, it is desirable to attain a high fill factor. To this end, the phantom diameter, for example, is selected to be large relative to the diameter of the RF coil. In one embodiment of a phantom for use with a body coil, cylinder 14 was selected to have an outside diameter of 13⅝ inches and a ¼ inch thick wall, while cylinder 16 was selected to have an outside diameter of 12 inches and a wall thickness of 3/16 inch. Both cylinders were 24 inches long. The cylindrical geometry is preferred to provide a surface that approximates the shape of the object studied (e.g., a patient) and an anatomically representative load to the RF coil, as well as to minimize RF field non-uniformity introduced by the phantom, itself. Other shapes, such as ellipsoidal and polygonal may also be advantageously employed.

The phantom geometry described above exploits the nature of the loading of the RF coil by eliminating all phantom material except for the outer shell (volume 22) defined by the two cylinders so as to achieve a lightweight phantom which provides a loading effect similar to that of a patient body or head. This can be understood by considering that the radio-frequency field in an NMR scanner is nearly all magnetic so that induction heating is the principal mechanism for dissipation of RF energy. The heating at a point on the surface of the phantom is proportional to the square of the radius of an eddy current loop (induced by an RF pulse) passing through that point. As a consequence, most of the loading caused by a homogeneous lossy object in an NMR scanner is due to the material near the object surface.

The medium used to fill volume 22 between cylinders 14 and 16 will be discussed next. In general, the medium comprises an electrolytic aqueous solution. The electrolytic solution is desirable to provide an anatomically equivalent dielectric material to shift the center frequency of the coil in a manner similar to that of a patient's body or head. One solution component comprises a salt which renders the medium sufficiently conductive and provides an electrically lossy material to dissipate the RF energy in a manner similar to that encountered in actual use. Other electrolytes include weak acids such as vinegar. A second solution component comprises a material which yields in solution paramagnetic ions needed to, for example, substantially shorten the spin spin and spin lattice relaxation properties of the solution such that the material in space 22 emits an NMR signal which decays very quickly and is not present when NMR signals used to measure the performance of the NMR scanner are obtained from, for example, the material (to be discussed hereinafter) contained in sphere 28. In this respect, the solution contained in space 22 is available to load the coil, but is "invisible" when actual NMR measurements are taken. Although the component providing the paramagnetic ions also affects the conductivity of the solution, the amount used must be selected to achieve the desired NMR properties (e.g., $T_1$, $T_2$, etc.). A non-paramagnetic salt is the principal means of adjusting the solution's conductivity. An example of a suitable non-paramagnetic salt is sodium chloride (NaCl). Suitable materials yielding paramagnetic ions include manganese chloride ($MnCl_2$,), copper sulfate ($CuSo_4$), gadolinium chloride ($GdCl_3$) and nickel chloride (NiCl). It will be, of course, recognized that other non-paramagnetic salts and paramagnetic ions may be advantageously employed with the inventive phantom. For the phantom dimensions specified above, space 22 is filled with approximately 9.5 liters of water into which 38 grams of sodium chloride and 22 grams of manganese chloride have been added. The resulting spin lattice relaxation time ($T_1$) was measured to be approximately 22 msec., while the spin spin relaxation time ($T_2$) was measured to be approximately 3 msec. These values of $T_1$ and $T_2$ are shorter than the time at which the NMR signal due to the medium in sphere 28 is measured. The total filled weight of the phantom, excluding the sphere, is approximately 18 kg.

The amount of RF loading provided by the phantom is determined by the surface area of the cylinders and thickness of space 22, and the concentration primarily of the non-paramagnetic salts present in the aqueous solution. It will be thus recognized that by varying the amount of non-paramagnetic salt in the solution various loading effects corresponding to patients of varying body weight may be achieved. In practice, it has been found that adding salt beyond that necessary to simulate loading by a 75 kg person is not effective to obtain additional loading because the primary effect is an increase in the coil center frequency, rather than an increase in loading. It will be, of course, recognized that while the preferred embodiment employs an aqueous solution to fill space 22, a gelatin or similar material may also be employed. The principal requirement is that the non-paramagnetic and paramagnetic ions are able to flow freely within the material. By way of comparison, the Q of an RF body coil was measured to be 63.7 with an approximately 75 kg person positioned therein, while a Q of 64.8 was measured for the coil with the inventive phantom. A closer match could be obtained if the salt concentration were to be adjusted. Even without such adjustment, however, the loading of the RF coil is sufficiently similar for most purposes.

While useful tests, such as measurement of loading effect on RF power amplifiers, may be performed using a phantom comprising the "NMR-invisible" material disposed between the concentric cylinders, in general, it is desirable to include a sphere 28 containing a material which emits NMR signals upon proper excitation. These NMR signals can then be used to measure signal to noise, field uniformity, spin spin and spin lattice relaxation times, as well as other parameters requiring clinical loading for proper evaluation. Such signals are obtained under realistic conditions due to the loading provided by the medium in volume 22 so that the measurements more closely approximate conditions encountered in actual use.

Sphere 28 is filled with an aqueous solution that is substantially non-conductive to eliminate image non-uniformities commonly caused by RF penetration effects in conductive solutions. The $T_1$, $T_2$ and spin density properties of the filler material must be selected to be representative of NMR properties of human tissues. By way of example, a sphere centered inside the phantom and having a diameter of 25.3 cm may be filled with a $1.3 \times 10^{-4}$ molar aqueous solution of manganese chloride (calculated $T_1$ and $T_2$ approximately 880 msec. and 63 msec., respectively). These values of $T_1$ and $T_2$ are within the range of values for human tissue. The concentration of paramagnetic ions in the solution can be varied to obtain different values of $T_1$ and $T_2$, as required. When filled, the sphere weighs approximately 9.8 kg. Because the $T_1$ and $T_2$ properties of fluids can vary significantly with temperature, the sphere may also be provided with a means for monitoring the temperature of the solution. By way of example, a thermometer could replace plug 34. The sphere should in general be constructed of materials having NMR properties described hereinbefore.

The spherical shape is preferred to minimize significant polarizing field distortion caused whenever there is a boundary between two materials with different magnetic permeabilities (i.e., the air surrounding sphere 28, and the fluid filler material). A homogeneous sphere whose magnetic permeability differs from that of the surrounding material has a useful property. If a uniform static magnetic field initially exists in the surrounding material, then the introduction of the sphere makes the magnetic field external to the sphere inhomogeneous, while the static magnetic field internal to the sphere becomes homogeneous. Thus, a spherical imaging volume is preferred to prevent perturbations of the static magnetic field because of the differences in the permeabilities of air and water. In this manner, by not perturbing the static field homogeneity the thickness of imaging slices selected through the sphere is not perturbed. Shapes other than spherical, although suitable for use in limited applications, will in general perturb both the external and internal static magnetic fields to various degrees. The distortion caused by a flat object, for example, can be several times greater than the inherent static magnetic field distortion present before the phantom is placed in the scan volume of an NMR scanner. The result of this additional distortion would be that measurements performed using a flat phantom would include measurements of inhomogeneities and signal to noise dominated by the phantom, itself, rather than the inherent inhomogeneity of the scan volume. Another advantage derived from the use of a spherical shape is that data collected in any plane through the sphere will generate identical images for analysis.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A phantom for measuring a performance parameter of a nuclear magnetic resonance (NMR) scanner capable of acquiring NMR data from a study object, said phantom comprising:
   a first medium;
   a second medium capable in use of generating an NMR test signal useful in measuring a performance parameter of said NMR scanner;
   a first means positionable in use within a radio-frequency (RF) coil forming part of said NMR scanner, said first means including an outer shell defining a volume for supporting said first medium;
   second means for containing said second medium;
   said first means further including support means capable of supporting said second means; and
   said first medium and the geometrical configuration of said first means being selected for jointly loading said RF coil in a manner similar to that of a predetermined study object and for predetermined NMR properties, said predetermined NMR properties being chosen such that an NMR signal, if any, generated by said first medium decays substantially to zero prior to the detection of the NMR signal generated by said second medium;
   whereby said first medium and said first means are substantially invisible to said NMR scanner and interference with the NMR signal generated by said second medium is substantially avoided.

2. The phantom of claim 1, said support means including means for adjusting the position of said second means relative to said first means.

3. The phantom of claim 2 wherein said first medium comprises an aqueous solution of an electrolyte to enhance the electrical conductivity of said aqueous solution, and at least one paramagnetic substance to alter at least one NMR parameter of said aqueous solution.

4. The phantom of claim 3 wherein said electrolyte comprises sodium chloride and wherein said paramagnetic substance comprises at least one of manganese chloride, nickel chloride, gadolinium chloride and copper sulfate.

5. The phantom of claim 3 wherein said concentration of said electrolyte in said solution is adjustable so as to vary the loading of said RF coil and wherein the concentration of said paramagnetic substance is adjustable to vary at least one of the NMR parameters of said aqueous solution.

6. The phantom of claim 2 wherein said second medium comprises a paramagnetic aqueous solution, wherein the concentration of paramagnetic ions therein is selected to simulate at least one NMR parameter of said study object so as to produce an NMR test signal detectable by said NMR scanner for measuring the performance of said NMR scanner.

7. The phantom of claim 2 wherein said second means comprises a substantially spherical geometry.

8. The phantom of claim 2 wherein said phantom comprises two concentrically disposed cylinders of different diameters and a pair of end plates fastened to opposite ends of said cylinders, said first medium being disposed within the volume defined between the side walls of said cylinders and said end plates and wherein said support means comprises the volume defined within the innermost of said concentrically disposed cylinders.

9. The phantom of claim 8 where said first medium comprises an aqueous solution of electrolyte to enhance the electrical conductivity of said aqueous solution, and at least one paramagnetic substance to alter at least one NMR parameter of said aqueous solution.

10. The phantom of claim 9 wherein said electrolyte comprises sodium chloride and wherein said paramagnetic substance comprises at least one of manganese chloride, nickel chloride, gadolinium chloride and copper sulfate.

11. The phantom of claim 9 wherein the concentration of said salt in said solution is adjustable so as to vary the loading of said RF coil and wherein the concentration of said paramagnetic substance is adjustable to vary at least one of the NMR parameters of said solution.

12. The phantom of claim 2 further comprising means for measuring the temperature of said second medium.

13. The phantom of claim 1 wherein said phantom comprises two concentrically disposed cylinders of different diameters and a pair of end plates, at least one of which is provided with an opening therein, fastened to opposite ends of said cylinders, said first medium being disposed within the volume defined between the side walls of said cylinders and said end plates.

14. The phantom of claim 13, said supporting means including means for adjusting the position of said second means relative to said first means.

15. The phantom of claim 14 wherein said first medium comprises an aqueous solution of electrolyte to enhance the electrical conductivity of said aqueous solution, and at least one paramagnetic substance to alter at least one NMR parameter of said aqueous solution.

16. The phantom of claim 15 wherein said electrolyte comprises sodium chloride and wherein said paramagnetic substance comprises at least one of manganese chloride, nickel chloride, gadolinium chloride and copper sulfate.

17. The phantom of claim 15 wherein the concentration of said electrolyte in said solution is adjustable so as to vary the loading of said RF coil and wherein the concentration of said paramagnetic substance is adjustable to vary at least one of the NMR parameters of said aqueous solution.

18. The phantom of claim 13 wherein said second medium comprises a paramagnetic aqueous solution wherein the concentration of paramagnetic ions therein is selected to simulate at least one NMR parameter of said study object so as to produce a study NMR signal detectable by said NMR scanner for measuring the performance of said NMR scanner.

19. The phantom of claim 13 wherein said second means comprises a substantially spherical geometry.

20. The phantom of claim 13 further comprising means for measuring the temperature of said second medium.

21. A phantom for measuring a performance parameter of a nuclear magnetic resonance (NMR) scanner capable of acquiring NMR data from a predetermined study object, said scanner including a radio frequency (RF) coil, said phantom comprising:
 a first structure positionable in use within said RF coil, said first structure including an elongate outer shell and an elongate inner shell coaxially nested within said outer shell and of substantially equal length, and a pair of annular end plates fastened to opposite ends of said shells to enclose a first volume;
 a first medium disposed in said first volume;
 a second structure disposed within said inner shell and defining a second volume;
 a second medium disposed in said second volume capable in use of generating an NMR test signal useful in measuring a performance parameter of said NMR scanner;
 said first medium and the geometrical configuration of said first structure being selected to provide predetermined NMR properties and jointly to load said RF coil in a manner similar to that of said predetermined study object, said predetermined NMR properties being chosen such that an NMR signal, if any, generated by said first medium decays substantially to zero prior to the detection of the NMR signal generated by said second medium;
 whereby said first medium and said first structure are substantially invisible to said NMR scanner and interference with the NMR signal generated by said second medium is substantially avoided.

22. The phantom of claim 21 wherein said first structure further includes means for adjustably supporting said second structure.

23. The phantom of claim 22 wherein said first medium comprises an aqueous solution including an electrolyte for enhancing the electrical conductivity of said solution, said solution further including at least one paramagnetic substance for altering at least one NMR parameter of said solution.

24. The phantom of claim 23 wherein said electrolyte comprises sodium chloride and wherein said paramagnetic substance comprises at least one of manganese chloride, nickel, chloride, gadolinium chloride and copper sulfate.

25. The phantom of claim 22 wherein said second medium comprises a paramagnetic aqueous solution having a concentration of paramagnetic ions selected to simulate at least one NMR parameter of said study object so as to produce said NMR test signal.

26. The phantom of claim 22, wherein said second structure is configured as a hollow sphere.

27. The phantom of claim 21 and further comprising means for measuring the temperature of said second medium.

* * * * *